US012676573B2

(12) United States Patent
Shugar et al.

(10) Patent No.: US 12,676,573 B2
(45) Date of Patent: Jul. 7, 2026

(54) MULTI-GLASS MODULE FOR A SOLAR TRACKER APPARATUS

(71) Applicant: Nextpower LLC, Fremont, CA (US)

(72) Inventors: Daniel Shugar, Pacifica, CA (US);
Alexander W. Au, Oakland, CA (US)

(73) Assignee: Nextpower LLC, Fremont, CA (US)

( * ) Notice: Subject to any disclaimer, the term of this patent is extended or adjusted under 35 U.S.C. 154(b) by 0 days.

(21) Appl. No.: 18/969,778

(22) Filed: Dec. 5, 2024

(65) Prior Publication Data

US 2025/0211162 A1     Jun. 26, 2025

Related U.S. Application Data

(60) Provisional application No. 63/612,444, filed on Dec. 20, 2023.

(51) Int. Cl.
H02S 20/32          (2014.01)
H10F 77/12          (2025.01)

(52) U.S. Cl.
CPC ............ H02S 20/32 (2014.12); H10F 77/126 (2025.01)

(58) Field of Classification Search
CPC .......... H02S 20/32; H02S 20/30; H02S 30/10; H10F 77/126; Y02E 10/47; F24S 25/20; F24S 25/67; F24S 30/425
See application file for complete search history.

(56) References Cited

U.S. PATENT DOCUMENTS

| | | |
|---|---|---|
| 7,472,876 B2 | 1/2009 | Jones |
| D651,969 S | 1/2012 | Turk et al. |
| D651,970 S | 1/2012 | Turk et al. |
| 8,567,134 B1 | 10/2013 | Grushkowitz et al. |
| D713,784 S | 9/2014 | Wildes |
| | (Continued) | |

FOREIGN PATENT DOCUMENTS

| | | |
|---|---|---|
| AU | 2020202253 B1 | 10/2020 |
| AU | 2019262608 A1 | 11/2020 |
| | (Continued) | |

OTHER PUBLICATIONS

International Searching Authority, "Partial International Search Report and Written Opinion", From Application No. PCT/US2024/058610, Mailed Feb. 28, 2025, pp. 18.

(Continued)

*Primary Examiner* — Michael Y Sun
(74) *Attorney, Agent, or Firm* — Fredrikson & Byron, P.A.

(57) ABSTRACT

A solar tracing system includes a torque tube, a first single frame structure coupled to the torque tube, and a second single frame structure coupled to the torque tube. The first single frame structure includes first frame structure first and second module receptacles at opposite sides of the first frame structure, a first pair of solar modules received at the first frame structure first and second module receptacles, a first frame structure coupling flange, and a first frame structure coupling flange receptacle. The second single frame structure includes second frame structure first and second module receptacles at opposite sides of the second frame structure, a second pair of solar modules received at the second frame structure first and second module receptacles, a second frame structure coupling flange, and a second frame structure coupling flange receptacle.

15 Claims, 23 Drawing Sheets

(56)          References Cited

U.S. PATENT DOCUMENTS

| | | | |
|---|---|---|---|
| 9,281,778 | B2 | 3/2016 | Corio et al. |
| D804,407 | S | 12/2017 | Au |
| 10,069,455 | B2 | 9/2018 | Corio et al. |
| D853,954 | S | 7/2019 | Mcpheeters |
| D862,379 | S | 10/2019 | Au |
| 10,480,829 | B2 | 11/2019 | Matsuda et al. |
| D905,626 | S | 12/2020 | Delgado-Nanez |
| 11,616,467 | B2 | 3/2023 | Au |
| 2014/0076306 | A1 | 3/2014 | Kalus et al. |
| 2016/0365827 | A1 | 12/2016 | Au |
| 2017/0170779 | A1 | 6/2017 | Yamashita |
| 2017/0294867 | A1 | 10/2017 | Pesce et al. |
| 2019/0341878 | A1 | 11/2019 | Watson et al. |
| 2020/0153382 | A1 | 5/2020 | Ballentine et al. |
| 2021/0075366 | A1 | 3/2021 | West et al. |
| 2022/0294386 | A1 | 9/2022 | Creasy et al. |
| 2023/0291349 | A1 | 9/2023 | Ayllon Gomez et al. |
| 2023/0327603 | A1 | 10/2023 | Taha et al. |
| 2023/0402963 | A1 | 12/2023 | Yadlapalli et al. |

FOREIGN PATENT DOCUMENTS

| | | | | | |
|---|---|---|---|---|---|
| CN | 209218014 | U | 8/2019 | | |
| CN | 112821859 | A | 5/2021 | | |
| CN | 114928320 | A | 8/2022 | | |
| DE | 102004055187 | A1 | 5/2006 | | |
| DE | 202007010999 | U1 | 2/2008 | | |
| EP | 3319228 | A1 | 5/2018 | | |
| ES | 2740049 | A2 | 2/2020 | | |
| WO | WO-2010124529 | A1 * | 11/2010 | ............ | H02S 20/00 |
| WO | 2014082687 | A1 | 6/2014 | | |
| WO | 2020076870 | A1 | 4/2020 | | |
| WO | 2020252091 | A1 | 12/2020 | | |
| WO | 2021119559 | A1 | 6/2021 | | |
| WO | 2023133203 | A1 | 7/2023 | | |

OTHER PUBLICATIONS

International Searching Authority, "International Search Report and Written Opinion", From Application No. PCT/US2024/058610, Mailed Apr. 22, 2025, pp. 25.

* cited by examiner

SECTION A-A
SCALE 1 : 2

DETAIL B
SCALE 1 : 1

DETAIL C
SCALE 1 : 1

SECTION D-D
SCALE 1 : 2

DETAIL E
SCALE 1:1

DETAIL F
SCALE 1 : 1

SECTION G-G
SCALE 1 : 2

DETAIL H
SCALE 1 : 1

SECTION H
SCALE 1 : 2

DETAIL J
SCALE 1 : 1

MULTI-GLASS MODULE FOR A SOLAR TRACKER APPARATUS

RELATED APPLICATION

This disclosure claims priority to U.S. provisional patent application No. 63/612,444, filed on Dec. 20, 2023, the contents of which are hereby incorporated by reference.

TECHNICAL FIELD

This disclosure relates generally to solar tracking systems and solar module frames.

BACKGROUND

The present application relates generally to a tracking apparatus for solar panels. More specifically, embodiments of the present invention provide tracking apparatuses that are suitable for solar panels. In a specific embodiment, a tracking apparatus according to the present invention is balanced, and uses a pair of smaller modules configured as a single frame structure, among other aspects. There are other embodiments as well.

As the population of the world increases, industrial expansion has lead to an equally large consumption of energy. Energy often comes from fossil fuels, including coal and oil, hydroelectric plants, nuclear sources, and others. As an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use come from turbines run on coal or other forms of fossil fuel, nuclear power generation plants, and hydro-electric plants, as well as other forms of renewable energy. Often times, home and business use of electrical power has been stable and widespread.

Most importantly, much if not all of the useful energy found on the Earth comes from our sun. Generally all common plant life on the Earth achieves life using photo-synthesis processes from sunlight. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies have been developed to capture solar energy, concentrate it, store it, and convert it into other useful forms of energy.

Solar panels have been developed to convert sunlight into energy. As an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still limitations. Often, solar panels are unable to convert energy at their full potential due to the fact that the sun is often at an angle that is not optimum for the solar cells to receive solar energy. In the past, various types of conventional solar tracking mecha-nisms have been developed.

Unfortunately, conventional solar tracking techniques are often inadequate. These and other limitations are described throughout the present specification, and may be described in more detail below.

From the above, it is seen that techniques for improving solar systems are highly desirable.

SUMMARY

The present application relates generally to a tracking apparatus for solar panels. More specifically, embodiments of the present invention provide tracking apparatuses that are suitable for solar panels. In a specific embodiment, a tracking apparatus according to the present invention is balanced, and uses a pair of smaller modules configured as a single frame structure, among other aspects. There are other embodiments as well.

In an example, the present invention provides a solar tracker apparatus. The apparatus has a support structure extending from a first end to a second end. In an example, the support structure comprising a torque tube. In an example, the apparatus has a plurality of multi-glass thin film solar modules spatially disposed along the first end to the second end and at least one clamp device coupling a center region between a pair of the multi-glass thin film solar modules. In an example, the apparatus has a frame structure configuring each of the multi-glass thin film solar modules. Each of the multi-glass thin film solar modules comprises a pair of frame-less solar module configured in a landscape orientation.

In an example, the present invention provides a solar tracker apparatus. The apparatus has a support structure extending from a first end to a second end. In an example, the support structure comprises a torque tube. The apparatus has a pair of multi-glass thin film solar modules spatially disposed along the first end to the second end. In an example, the apparatus has at least one clamp device cou-pling a center region between the pair of the multi-glass thin film solar modules. The apparatus has a frame structure configuring the pair of the multi-glass thin film solar mod-ules. In an example, the pair of the multi-glass thin film solar modules comprises a pair of frame-less solar module con-figured in a landscape orientation or a portrait orientation.

One embodiment includes a solar tracking system. This embodiment of the solar tracking system includes a torque tube, a first single frame structure, and a second single frame structure. The torque tube extends from a first torque tube end to a second torque tube end that is opposite the first torque tube end. The first single frame structure is coupled to the torque tube, and the second single frame structure is coupled to the torque tube. The first single frame structure includes a first frame structure first module receptacle at a first side of the first single frame structure, a first frame structure second module receptacle at a second side of the first single frame structure opposite the first side of the first single frame structure, a first pair of solar modules received at the first frame structure first module receptacle and at the first frame structure second module receptacle, a first frame structure coupling flange extending out from the first side of the first single frame structure, and a first frame structure coupling flange receptacle defined at the first side of the first single frame structure adjacent to the first frame structure coupling flange. The second single frame structure includes a second frame structure first module receptacle at a first side of the second single frame structure, a second frame structure second module receptacle at a second side of the second single frame structure opposite the first side of the second single frame structure, a second pair of solar modules received at the second frame structure first module receptacle and at the second frame structure second module receptacle, a second frame structure coupling flange extending out from the first side of the second single frame structure, and a second frame structure coupling flange receptacle defined at the first side of the second single frame structure adjacent to the second frame structure coupling flange.

In a further embodiment of this system, the first frame structure coupling flange is received at the second frame structure coupling flange receptacle, and the second frame structure coupling flange is received at the first frame structure coupling flange receptacle. For example, the first frame structure first and second module receptacles can be at different elevations along the first frame structure than each of the first frame structure coupling flange and the first frame structure coupling flange receptacle. In one particular example, the first frame structure coupling flange can contact the second frame structure coupling flange along a length between the first side of the first single frame structure and the first side of the second single frame structure. For instance, the first frame structure coupling flange and the second frame structure coupling flange can overlay one another along the length between the first side of the first single frame structure and the first side of the second single frame structure. In one particular such embodiment, the first frame structure coupling flange can be disposed at a different elevation along the first side of the first single frame structure than the second frame structure coupling flange is disposed along the first side of the second single frame structure.

In a further embodiment of this system, the first frame structure can further include a first plenum extending between the first frame structure first module receptacle at the first side of the first single frame structure and the first frame structure coupling flange at the first side of the first single frame structure. Similarly, the second frame structure can further include a second plenum extending between the second frame structure first module receptacle at the first side of the second single frame structure and the second frame structure coupling flange at the first side of the second single frame structure.

In a further embodiment of this system, the first frame structure further includes a first frame structure second coupling flange extending out from the second side of the first single frame structure, and a first frame structure second coupling flange receptacle defined at the second side of the first single frame structure adjacent to the first frame structure second coupling flange. In some examples, an elevational arrangement of the first frame structure second coupling flange and the first frame structure second coupling flange receptacle at the second side of the first single frame structure can be an inverse of an elevational arrangement of the first frame structure coupling flange and the first frame structure coupling flange receptacle at the first side of the first single frame structure. In some examples, the second frame structure can further include a second frame structure second coupling flange extending out from the second side of the second single frame structure, and a second frame structure second coupling flange receptacle defined at the second side of the second single frame structure adjacent to the second frame structure second coupling flange.

In a further embodiment of this system, the system can additionally include a clamping device between the first single frame structure and the second single frame structure. The clamping device can couple the first single frame structure to the second single frame structure. As one such example, the clamping device can include a rail having a pair of bolt receptacles. In such an example, the solar tracking system can further include a u-bolt received at each of the pair of bolt receptacles at the rail to couple the first single frame structure to the torque tube. For instance, the torque tube can be bounded by the u-bolt and the rail around an entire perimeter of the torque tube at a location of the rail and the u-bolt.

In a further embodiment of this system, each of the first pair of solar modules can be frame-less at an interface between each of the first pair of solar modules and the first frame structure first module receptacle and at an interface between each of the first pair of solar modules and the first frame structure second module receptacle. Likewise, each of the second pair of solar modules can be frame-less at an interface between each of the second pair of solar modules and the second frame structure first module receptacle and at an interface between each of the second pair of solar modules and the second frame structure second module receptacle. In some such examples, each of the first pair of solar modules includes a CIGS or CIS semiconductor material that interfaces with each of the first frame structure first module receptacle and the first frame structure second module receptacle, and each of the second pair of solar modules includes a CIGS or CIS semiconductor material that interfaces with each of the second frame structure first module receptacle and the second frame structure second module receptacle.

Another embodiment includes a single frame structure solar module. This embodiment of the single frame structure solar module includes a first module receptacle at a first side of the single frame structure, a second module receptacle at a second side of the single frame structure opposite the first side of the single frame structure, a first pair of solar modules received at the first module receptacle and at the second module receptacle, a first coupling flange extending out from the first side of the single frame structure, a first coupling flange receptacle defined at the first side of the single frame structure adjacent to the first coupling flange, a second coupling flange extending out from the second side of the single frame structure, and a second coupling flange receptacle defined at the second side of the single frame structure adjacent to the second coupling flange.

In a further embodiment of this single frame structure solar module, an elevational arrangement of the first coupling flange and the first coupling flange receptacle at the first side of the single frame structure can be an inverse of an elevational arrangement of the second coupling flange and the second coupling flange receptacle at the second side of the single frame structure.

In a further embodiment of this single frame structure solar module, the single frame structure solar module further includes a first plenum defined and extending between the first module receptacle and the first coupling flange at the first side of the single frame structure, and a second plenum defined and extending between the second module receptacle and the second coupling flange at the second side of the single frame structure.

In a further embodiment of this single frame structure solar module, each of the first pair of solar modules can be frame-less at an interface between each of the first pair of solar modules and the first module receptacle and at an interface between each of the first pair of solar modules and the second module receptacle. For example, each of the first pair of solar modules comprises a CIGS or CIS semiconductor material that interfaces with each of the first module receptacle and the second module receptacle. This can include a lack of any dedicated frame component at each of the first pair of solar modules between the CIGS or CIS semiconductor material and the first and second module receptacles at the single frame structure solar module.

Details of one or more examples are set forth in the accompanying drawings and the description below. Other features, objects, and advantages will be apparent from the description and drawings, and from the claims.

BRIEF DESCRIPTION OF DRAWINGS

FIG. 4 is a side view of an edge of the pair of solar modules configured on a single frame structure according to an example of the present invention.

DETAILED DESCRIPTION

The present application relates generally to a tracking apparatus for solar panels. More specifically, embodiments of the present invention provide tracking apparatuses that are suitable for solar panels. In a specific embodiment, a tracking apparatus according to the present invention is balanced and uses a pair of smaller modules configured as a single frame structure, among other aspects. There are other embodiments as well. Further details of the present In an example, the present invention provides a solar tracker apparatus. The apparatus has a support structure extending from a first end to a second end. In an example, the support structure comprises a torque tube. The apparatus has a pair of multi-glass thin film solar modules spatially disposed along the first end to the second end. In an example, the apparatus has at least one clamp device coupling a center region between the pair of the multi-glass thin film solar modules. The apparatus has a frame structure configuring the pair of the multi-glass thin film solar modules. In an example, the pair of the multi-glass thin film solar modules comprises a pair of frame-less solar module configured in a landscape orientation or a portrait orientation.

In an example, each of the frame-less solar modules comprises a CIGS or CIS semiconductor material. In an example, the support structure is configured as a balanced support structure. In an example, the pair of the multi-glass thin film solar modules has a first length of two (2) meters in a direction perpendicular to the support structure. In an example, the pair of the multi-glass thin film solar modules has a second length of 0.8 to 1.4 meters in a direction normal to the first direction. In an example, the clamp device is configured to a rail structure configured to the torque tube. In an example, the torque tube is configured to an off-set drive. In an example, the apparatus further has a micro-inverter device coupled to each of the plurality of multi-glass thin film solar modules. In an example, the torque tube is configured on a base structure. In an example, the torque tube has a length of 80 meters and greater. In an example, the at least one clamp device comprises a pair of openings configured for a U-bolt configured to a portion of the torque tube. Further details of the present apparatus can be found throughout the present specification and more particularly below.

Figure 1:
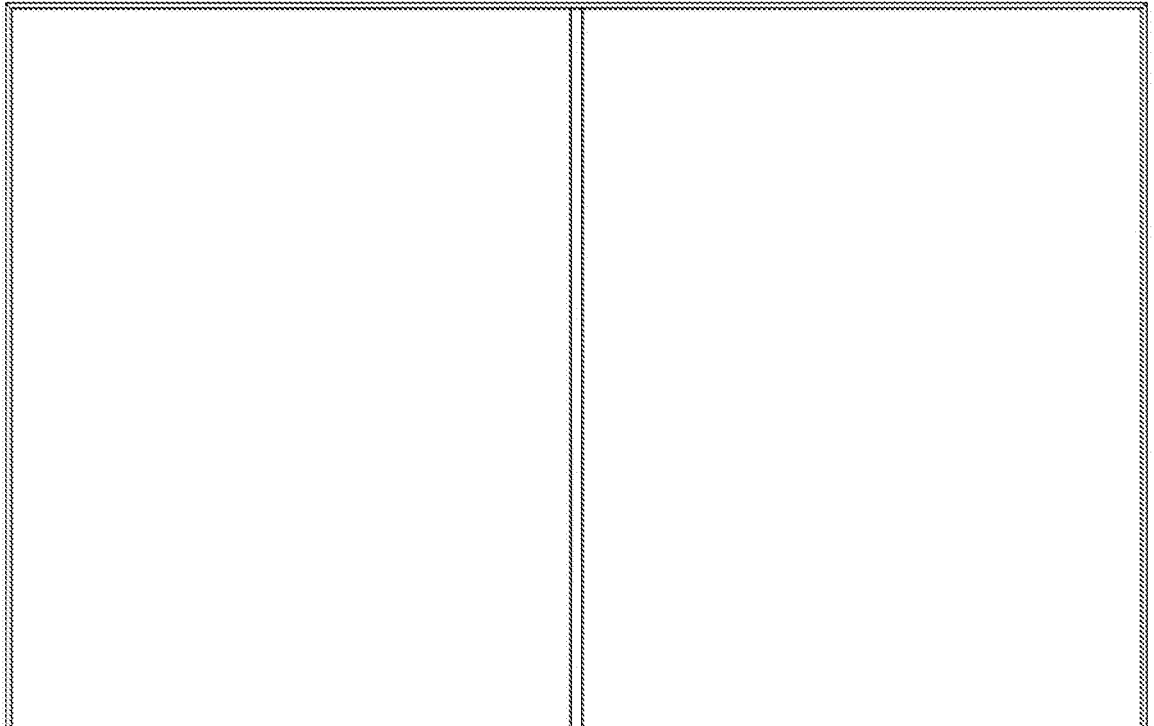
FIG. 1 is a top view of a pair of solar modules configured on a single frame structure according to an example of the present invention.

FIG. 1 is a top view of a pair of solar modules configured on a single frame structure according to an example of the present invention.

Figure 2:
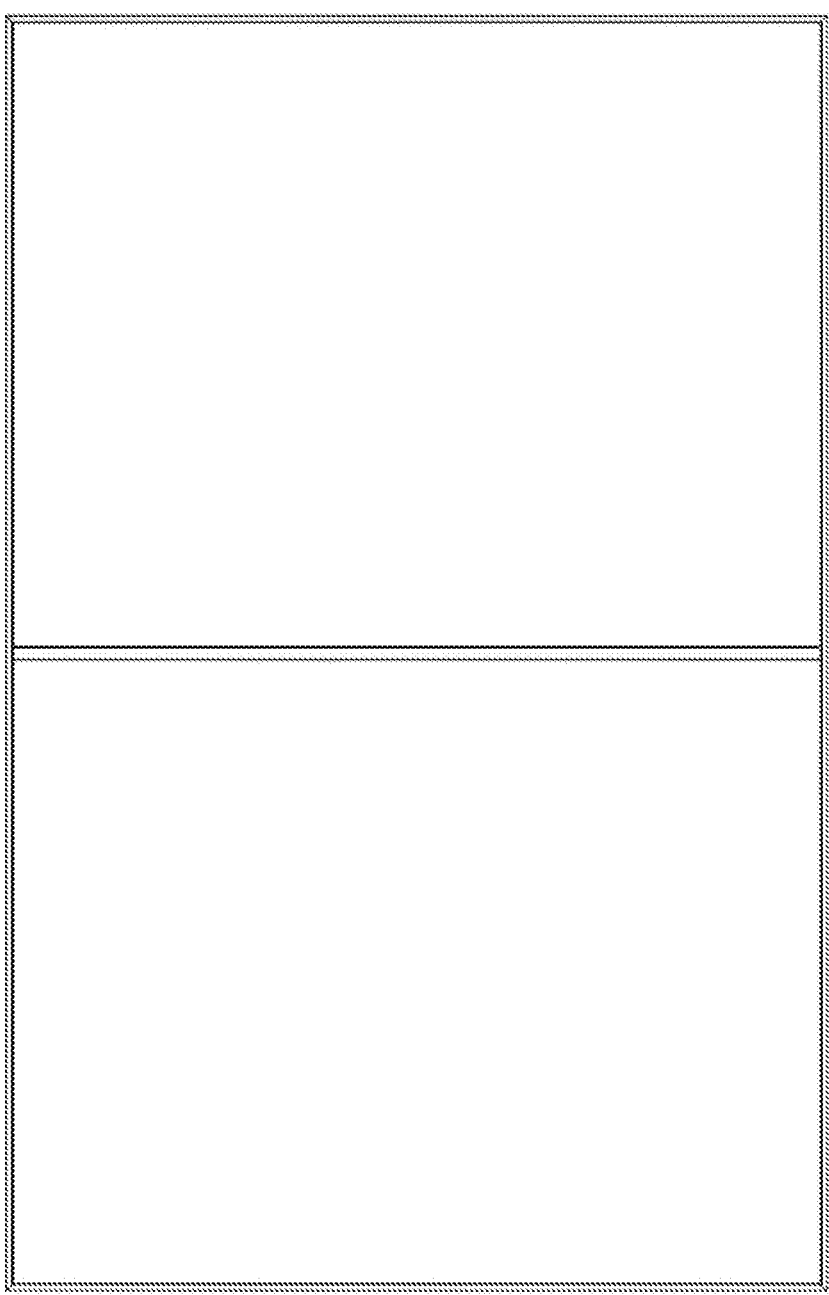
FIG. 2 is a top view of a pair of solar modules configured on a single frame structure according to an example of the present invention.

FIG. 2 is a top view of a pair of solar modules configured on a single frame structure according to an example of the present invention.

Figure 3:
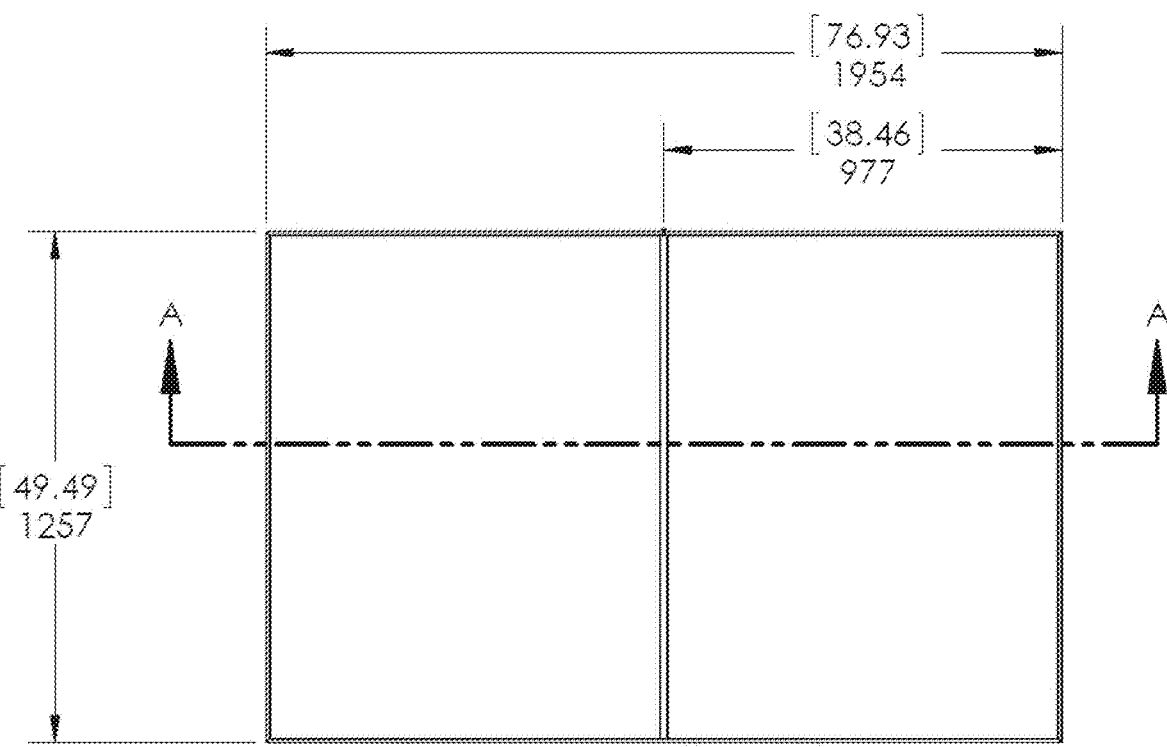
FIG. 3 is a top view of a pair of solar modules configured on a single frame structure, which also shows line A-A, according to an example of the present invention.

FIG. 3 is a top view of a pair of solar modules configured on a single frame structure, which also shows line A-A, according to an example of the present invention.

Figure 4:
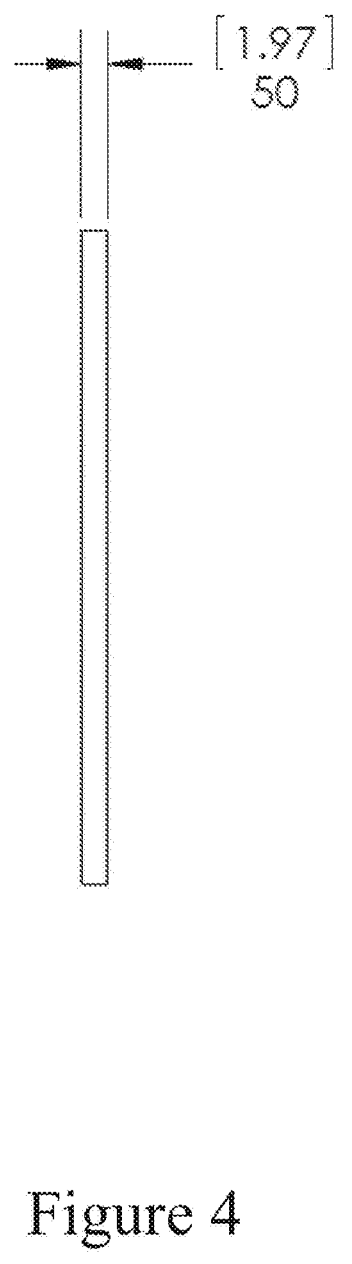

FIG. 4 is a side view of an edge of the pair of solar modules configured on a single frame structure according to an example of the present invention.

Figure 5:
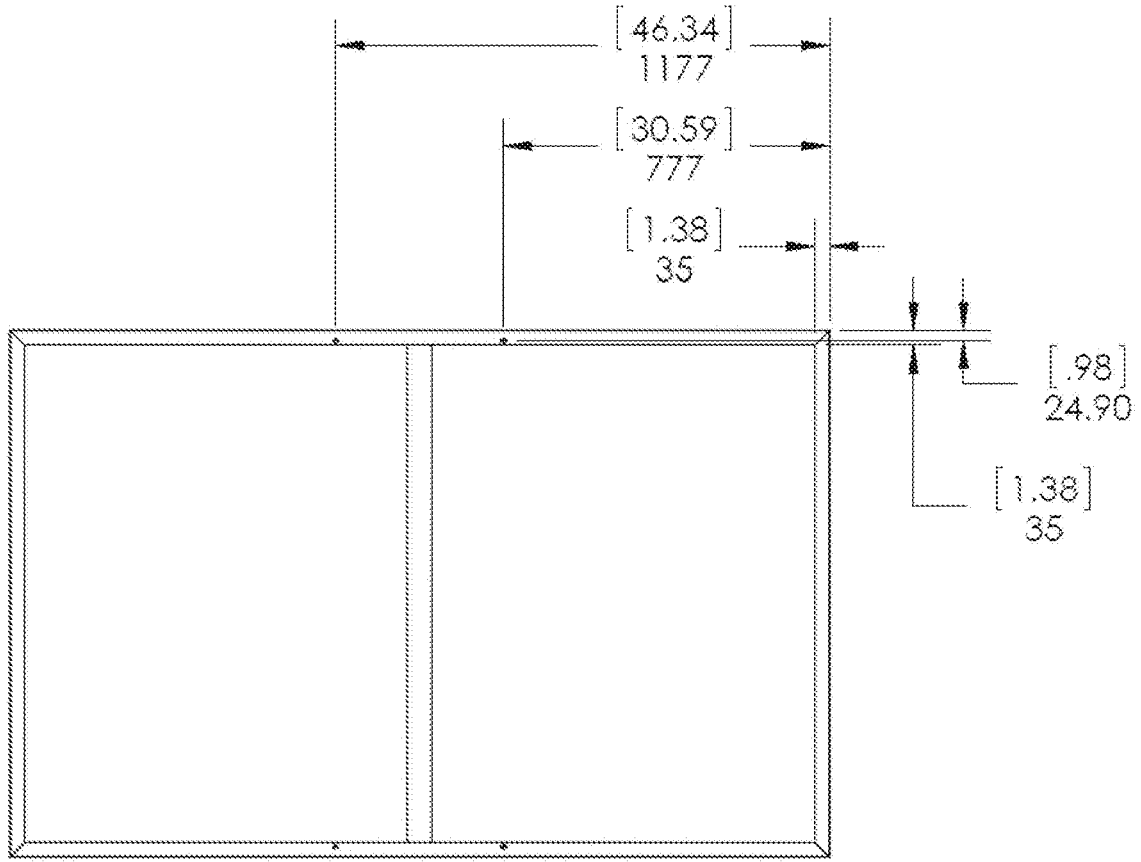
FIG. 5 is a bottom view of a pair of solar modules configured on a single frame structure according to an example of the present invention.

FIG. 5 is a bottom view of a pair of solar modules configured on a single frame structure according to an example of the present invention.

Figure 6:
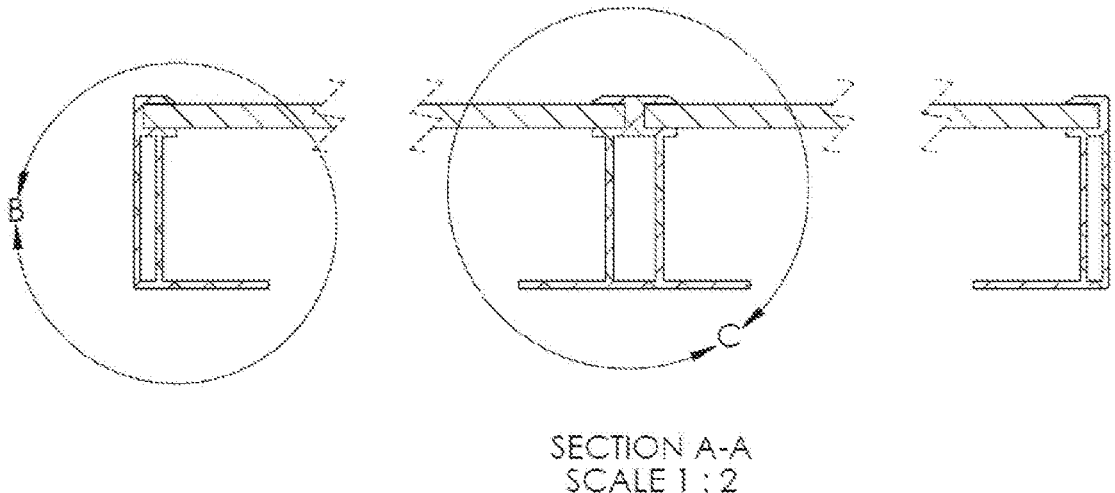
FIG. 6 shows a cross-sectional view along A-A of the pair of solar modules according to an example of the present invention.

FIG. 6 shows a cross-sectional view along A-A of the pair of solar modules according to an example of the present invention.

Figure 7:
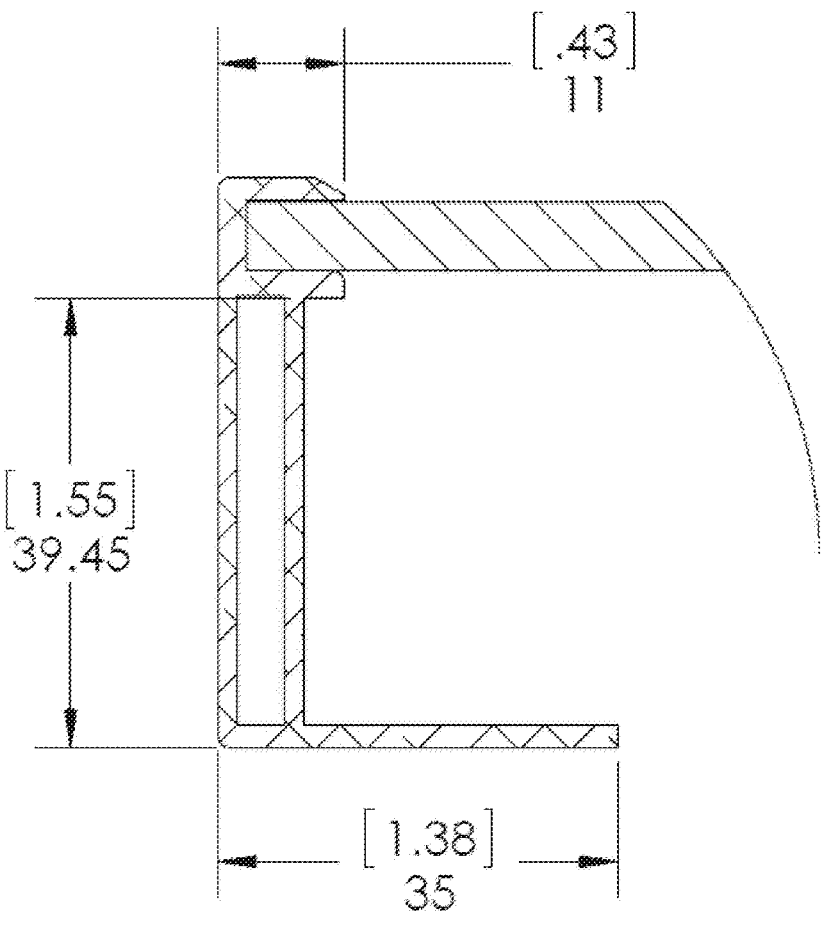
FIG. 7 shows a cross-sectional view detailing an edge region B along A-A of the pair of solar modules according to an example of the present invention.

FIG. 7 shows a cross-sectional view detailing an edge region B along A-A of the pair of solar modules according to an example of the present invention.

Figure 8:
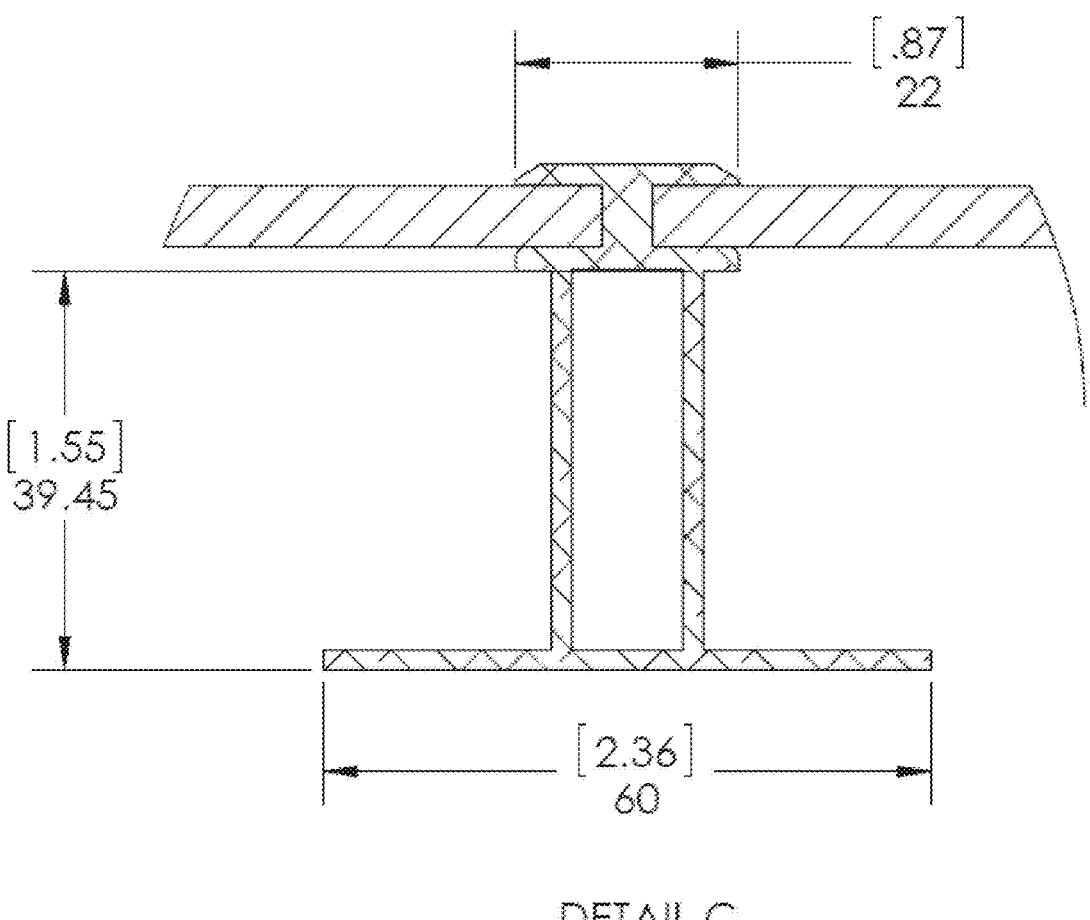
FIG. 8 shows a cross-sectional view detailing a center region C along A-A of the pair of solar modules according to an example of the present invention.

FIG. 8 shows a cross-sectional view detailing a center region C along A-A of the pair of solar modules according to an example of the present invention.

Figure 9:
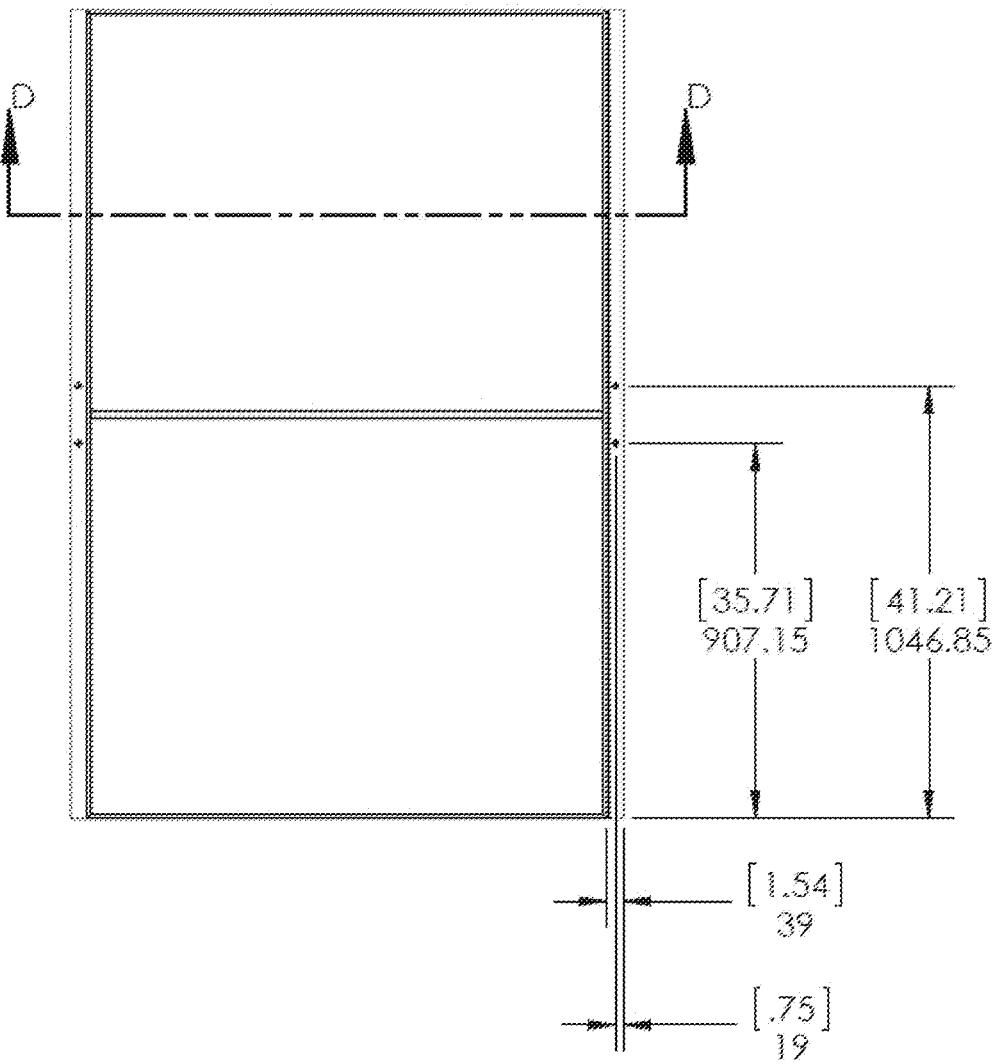
FIG. 9 is a top view of a pair of solar modules configured on a single frame structure, which also shows line D-D, according to an example of the present invention.

FIG. 9 is a top view of a pair of solar modules configured on a single frame structure, which also shows line D-D, according to an example of the present invention.

Figure 10:
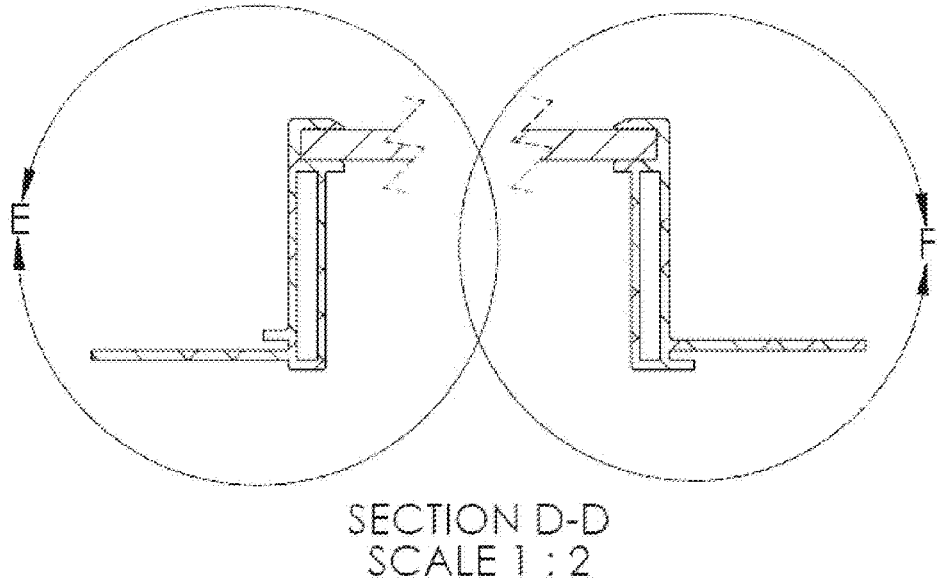
FIG. 10 is a side view of a cross-section of the pair of solar modules configured on a single frame structure according to an example of the present invention.

FIG. 10 is a side view of a cross-section of the pair of solar modules configured on a single frame structure according to an example of the present invention.

Figure 11:
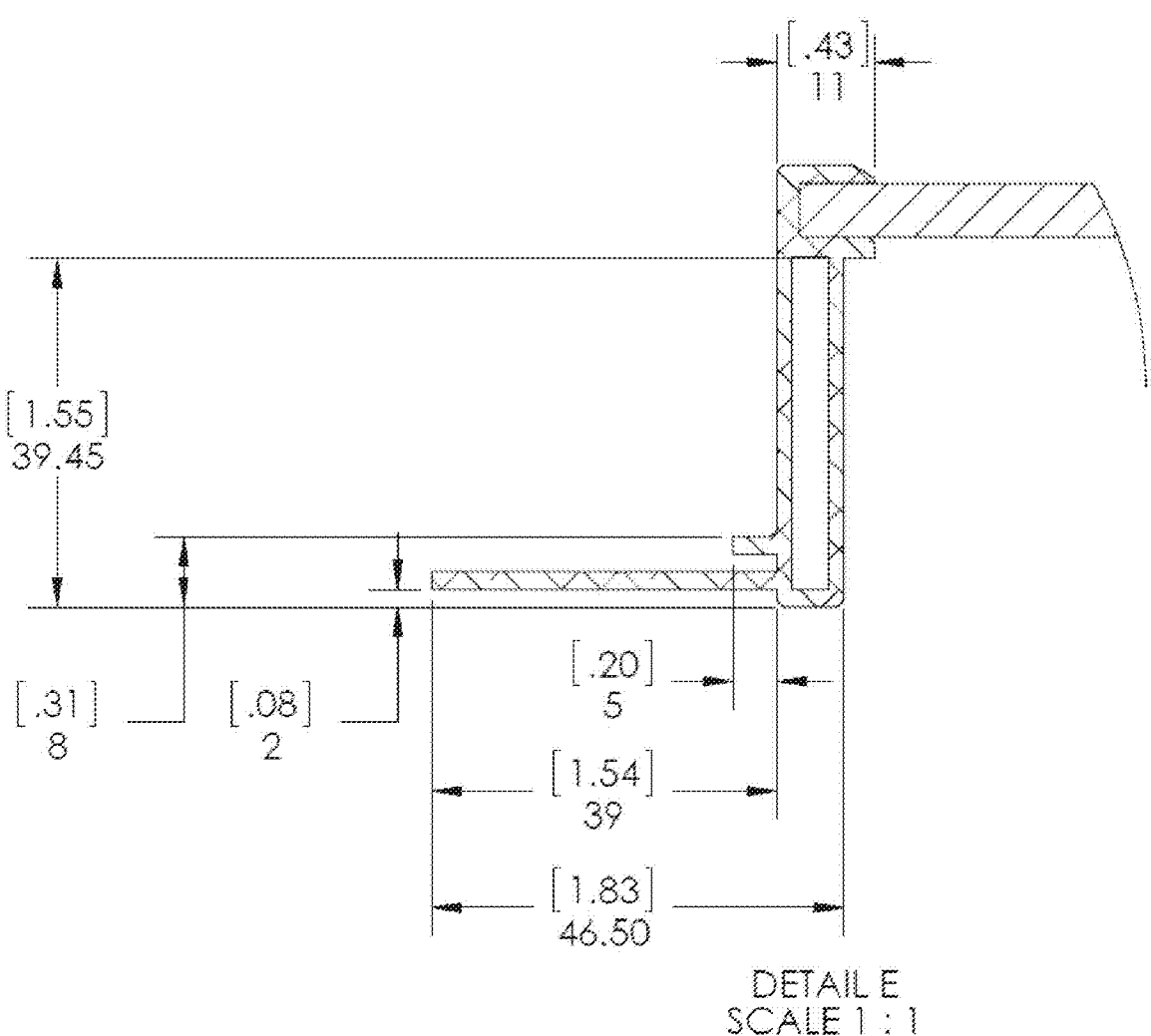
FIG. 11 shows a cross-sectional view detailing a region E along D-D of the pair of solar modules according to an example of the present invention.

FIG. 11 shows a cross-sectional view detailing a region E along D-D of the pair of solar modules according to an example of the present invention.

Figure 12:
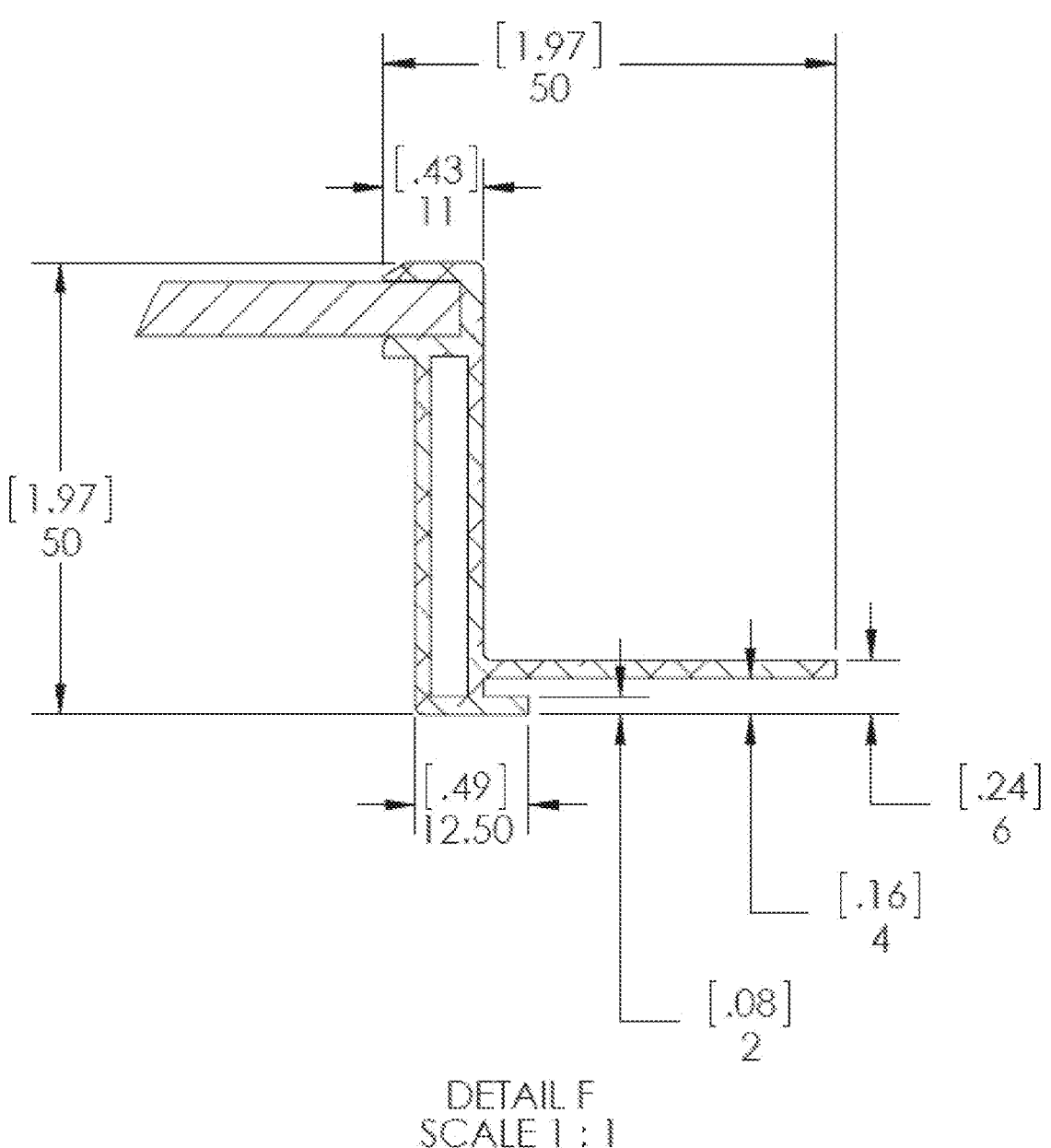
FIG. 12 shows a cross-sectional view detailing a region F along D-D of the pair of solar modules according to an example of the present invention.

FIG. 12 shows a cross-sectional view detailing a region F along D-D of the pair of solar modules according to an example of the present invention.

Figure 13:
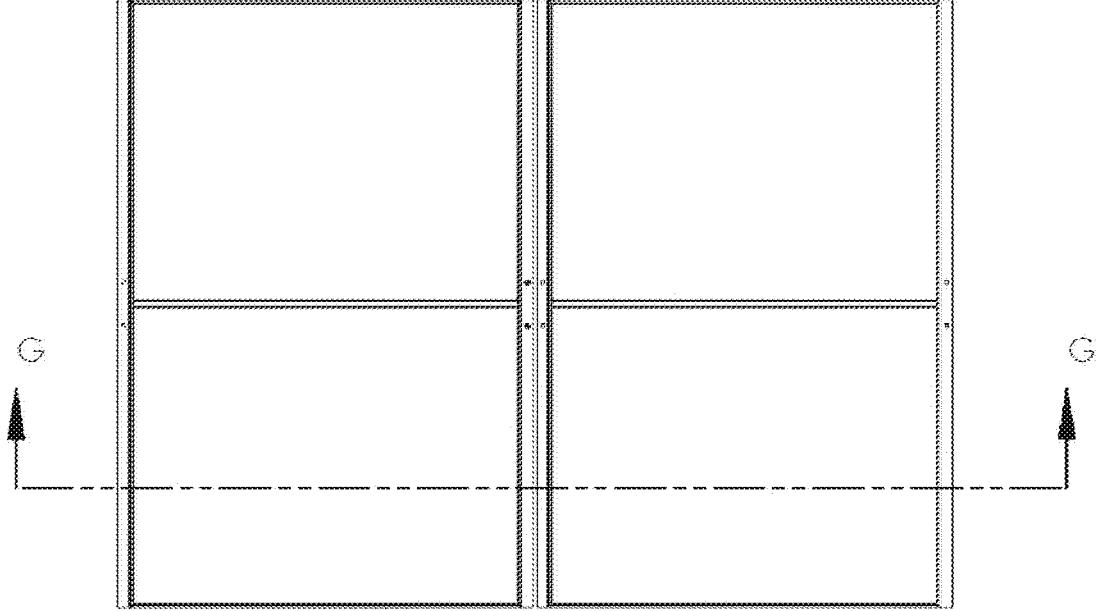
FIG. 13 is a top view of a pair of solar modules configured on a single frame structure, which also shows line G-G, according to an example of the present invention.

FIG. 13 is a top view of a pair of solar modules configured on a single frame structure, which also shows line G-G, according to an example of the present invention.

Figure 14:
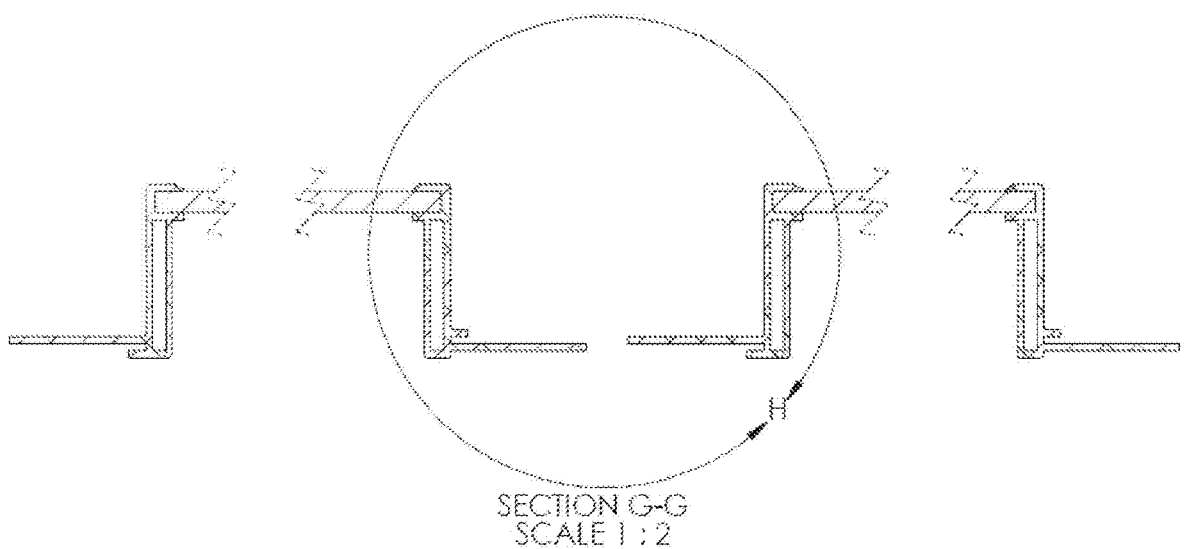
FIG. 14 is a side view of a cross-section of the pair of solar modules configured on a single frame structure according to an example of the present invention.

FIG. 14 is a side view of a cross-section of the pair of solar modules configured on a single frame structure according to an example of the present invention.

Figure 15:
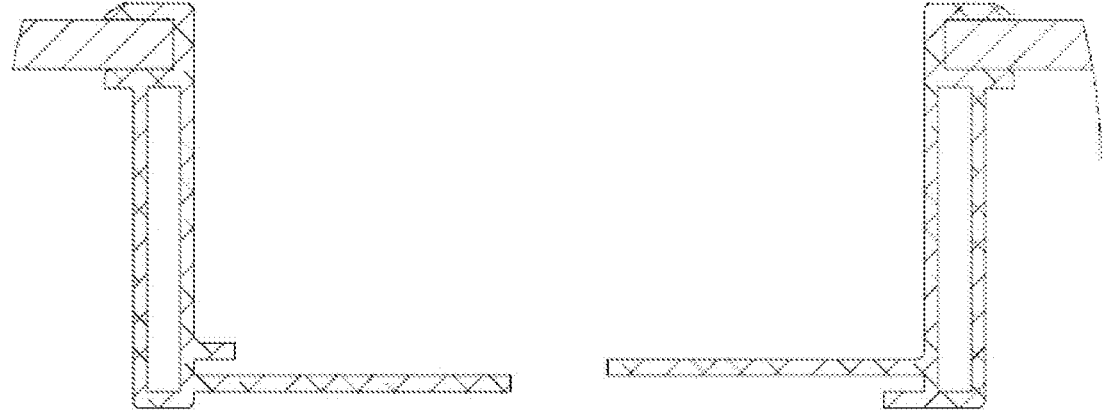
FIG. 15 shows a cross-sectional view detailing a region H along G-G of the pair of solar modules according to an example of the present invention.

FIG. 15 shows a cross-sectional view detailing a region H along G-G of the pair of solar modules according to an example of the present invention.

Figure 16:
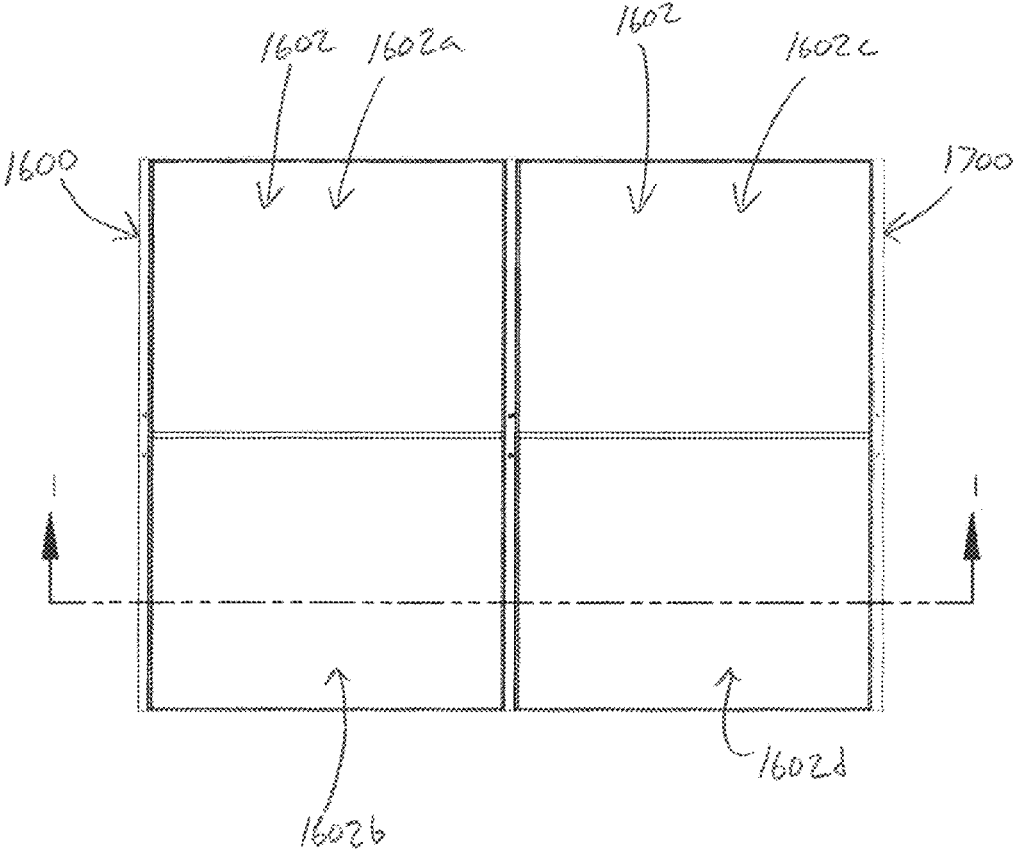
FIG. 16 is a top view of a pair of solar modules configured on a single frame structure, which also shows line I-I, according to an example of the present invention.

FIG. 16 is a top view of a pair of solar modules configured on a single frame structure, which also shows line I-I, according to an example of the present invention.

Figure 17:
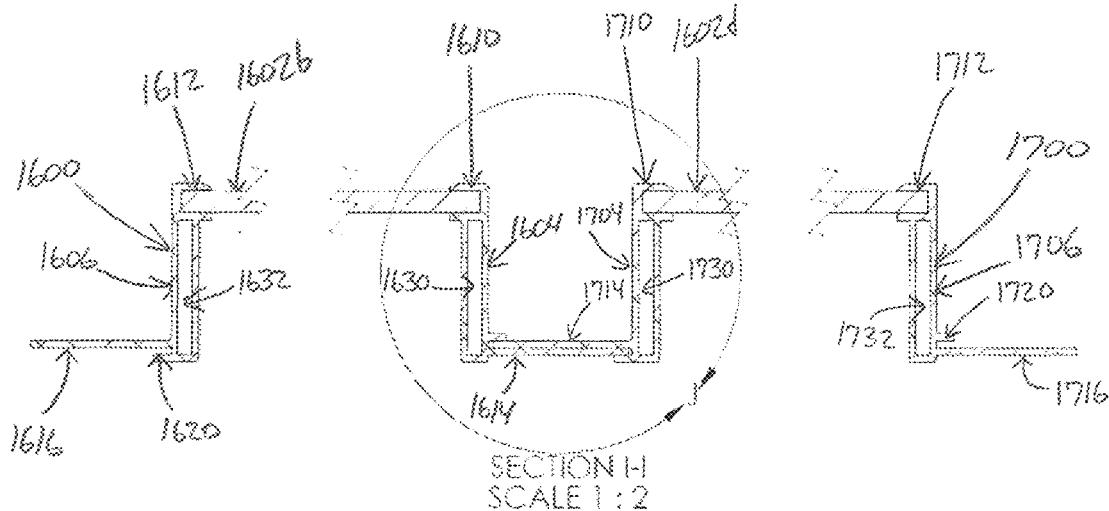
FIG. 17 is a side view of a cross-section along line I-I of the pair of solar modules configured on a single frame structure according to an example of the present invention.

FIG. 17 is a side view of a cross-section of the pair of solar modules configured on a single frame structure according to an example of the present invention.

Figure 18:
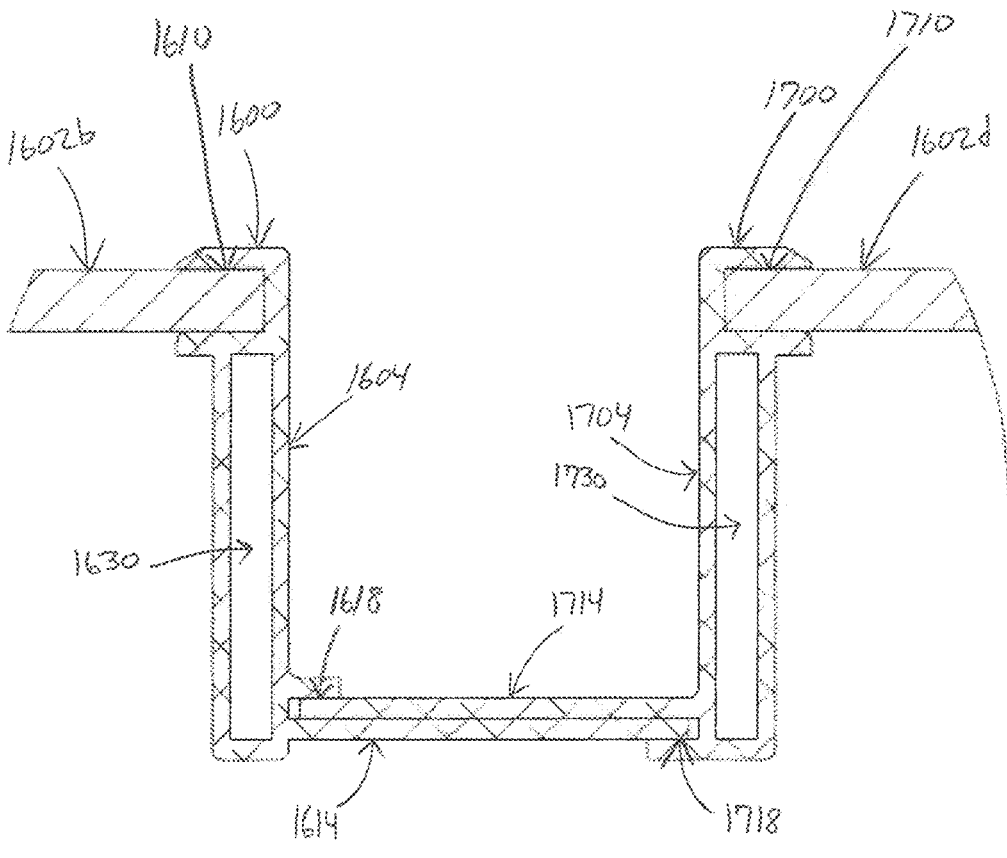
FIG. 18 shows a cross-sectional view detailing a region J along I-I of the pair of solar modules according to an example of the present invention.

FIG. 18 shows a cross-sectional view detailing a region J along I-I of the pair of solar modules according to an example of the present invention.

Figure 19:
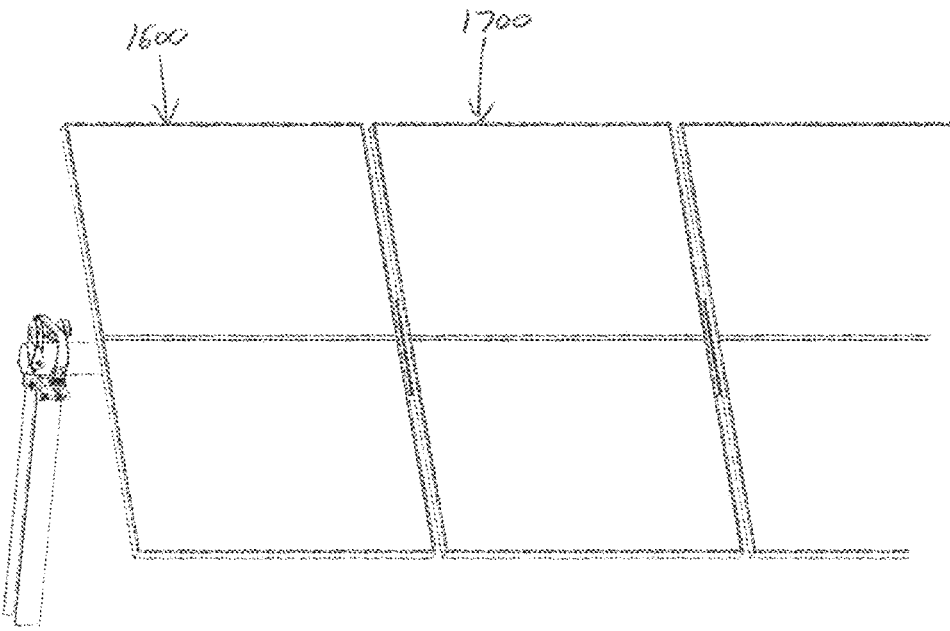
FIG. 19 is a front perspective view of a plurality of solar modules configured on a tracker apparatus according to an example of the present invention.

FIG. 19 is a front perspective view of a plurality of solar modules configured on a tracker apparatus according to an example of the present invention.

Figure 20:
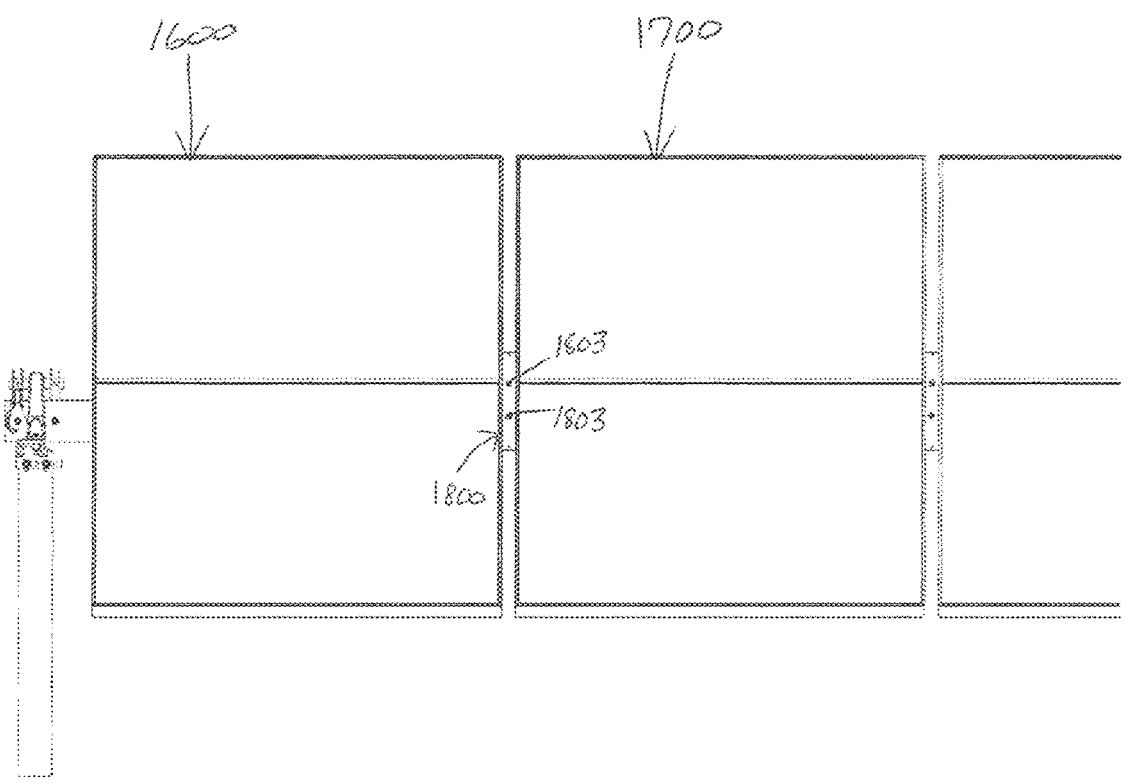
FIG. 20 is a front view of a plurality of solar modules configured on a tracker apparatus according to an example of the present invention.

FIG. 20 is a front view of a plurality of solar modules configured on a tracker apparatus according to an example of the present invention.

Figure 21:
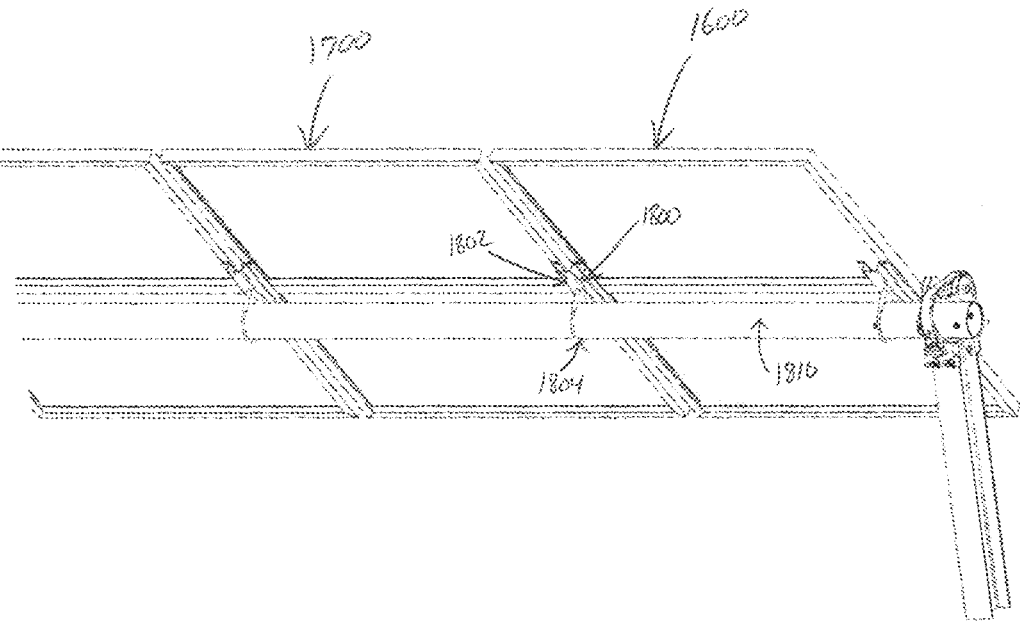
FIG. 21 is a back perspective view of a plurality of solar modules configured on a tracker apparatus according to an example of the present invention.

FIG. 21 is a back perspective view of a plurality of solar modules configured on a tracker apparatus according to an example of the present invention.

8

Figure 22:
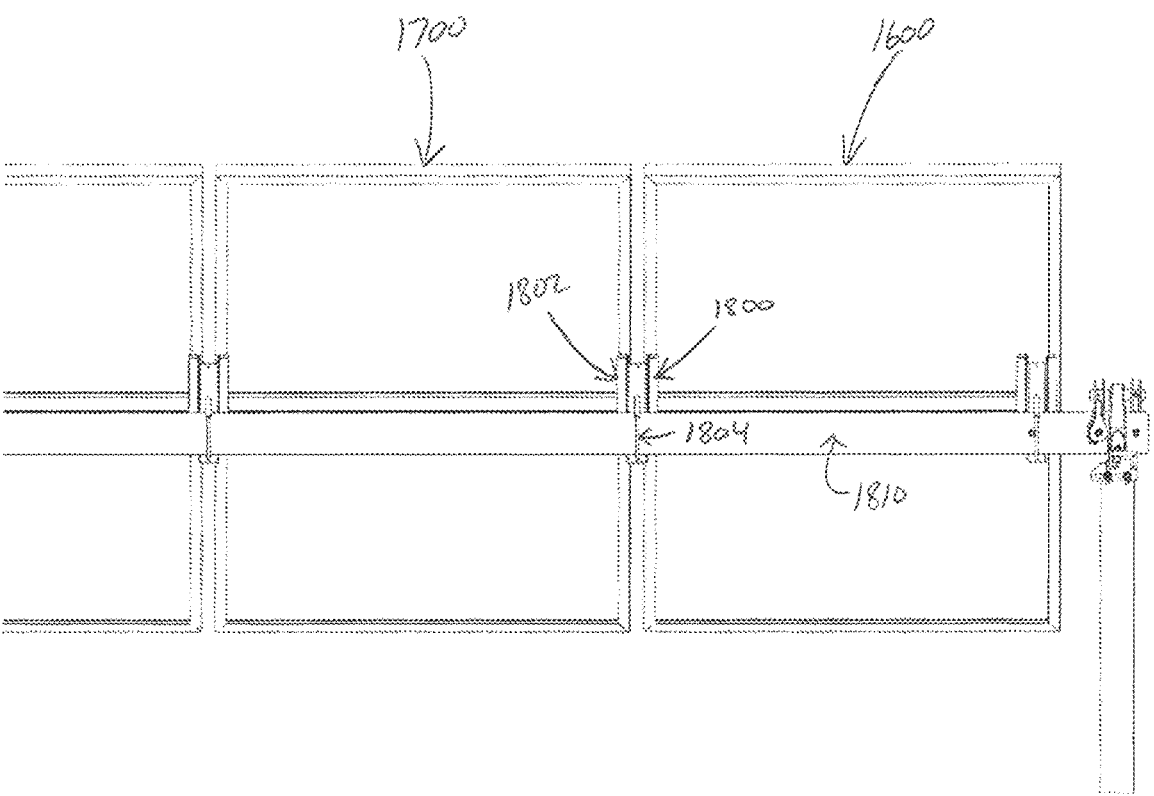
FIG. 22 is a back view of a plurality of solar modules configured on a tracker apparatus according to an example of the present invention.

FIG. 22 is a back view of a plurality of solar modules configured on a tracker apparatus according to an example of the present invention.

Figure 23:
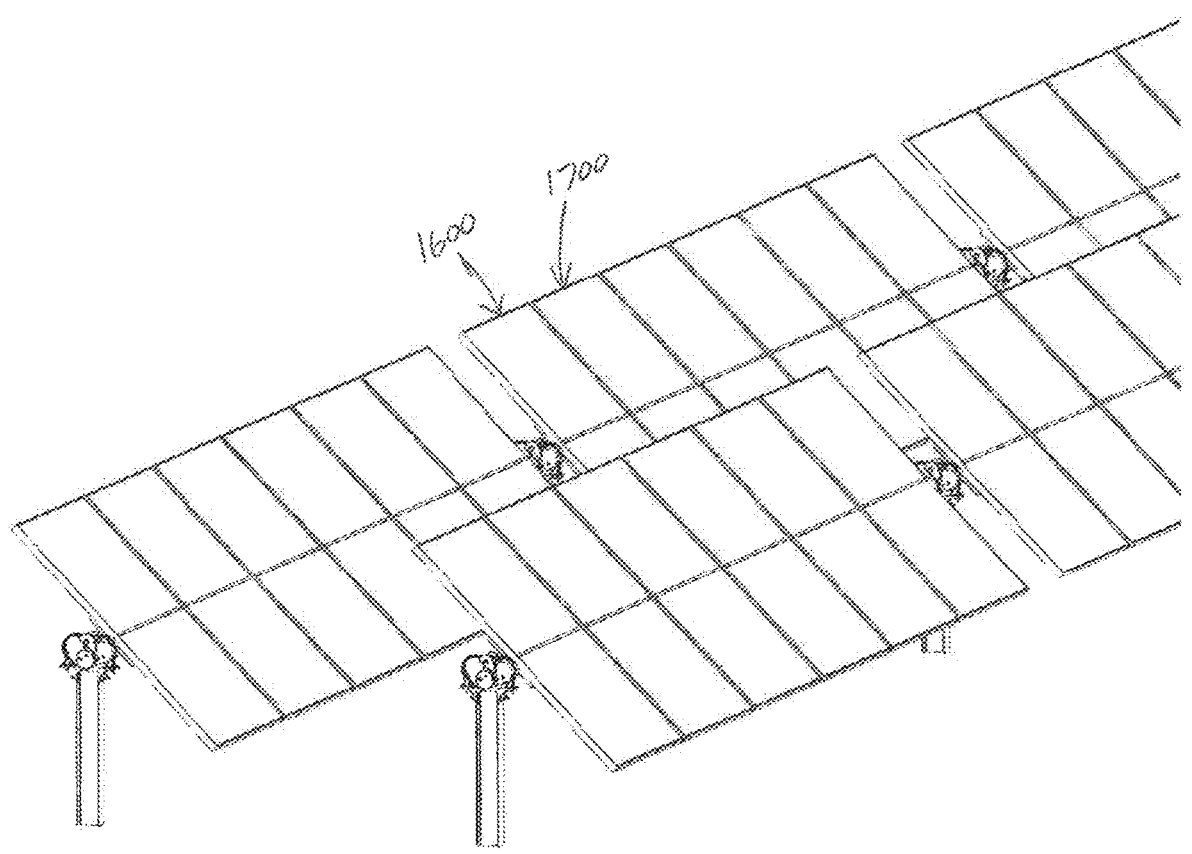
FIG. 23 is a plurality of solar tracker apparatuses according to an example of the present invention.

FIG. 23 is a plurality of solar tracker apparatuses according to an example of the present invention. Further details of each of the aforementioned examples can be found throughout the present specification and more particularly below.

In a specific embodiment, the present invention provides a tracker apparatus for solar modules. The tracker apparatus has a first pier comprising a first pivot device and a second pier comprising a drive mount. The drive mount is capable for construction tolerances in at least three-axis, and is configured to a drive device. The drive device has an off-set clamp device coupled to a cylindrical bearing device coupled to a clamp member. The apparatus has a cylindrical torque tube operably disposed on the first pier and the second pier. The cylindrical torque tube comprises a first end and a second end, and a notch. The notch is one of a plurality of notches spatially disposed along a length of the cylindrical torque tube. The apparatus has a clamp configured around an annular portion of the cylindrical torque tube and mate with the notch to prevent movement of the clamp. The clamp comprises a support region configured to support a portion of a solar module.

In an alternative embodiment, the present invention provides an alternative solar tracker apparatus. The apparatus has a drive device, a crank coupled to the drive device and configured in an offset manner to a frame assembly. The frame assembly is coupled to a plurality of solar modules.

In an example, the apparatus has a continuous torque tube spatially disposed from a first region to a second region. The crank comprises a first crank coupled to a first side of the drive device and a second crank coupled to a second side of the drive device. The crank comprises a first crank coupled to a first side of the drive device and a second crank coupled to a second side of the drive device; and further comprises a first torque tube coupled to the first crank and a second torque tube coupled to the second crank. The crank comprises a first crank coupled to a first side of the drive device and a second crank coupled to a second side of the drive device; and further comprises a first torque tube coupled to the first crank and a second torque tube coupled to the second crank, and further comprises a first swage fitting coupling the first crank to the first torque tube and a second swage fitting coupling the second crank to the second torque tube. The apparatus also has a pier coupled to the drive device. In an example, the apparatus also has a drive mount coupled to a pier.

In an alternative embodiment, the present invention provides an alternative solar tracker apparatus. The apparatus has a center of mass with an adjustable hanger assembly configured with a clam shell clamp assembly on the adjustable hanger assembly and a cylindrical torque tube comprising a plurality of torque tubes configured together in a continuous length from a first end to a second end such that the center of mass is aligned with a center of rotation of the cylindrical torque tubes to reduce a load of a drive motor operably coupled to the cylindrical torque tube.

In an example, the drive motor is operable to move the torque tube about the center of rotation and is substantially free from a load. The center of rotation is offset from a center of the cylindrical torque tube.

In an alternative embodiment, the present invention provides a solar tracker apparatus. The apparatus has a clamp housing member configured in a upright direction. The clamp housing member comprises a lower region and an upper region. The lower region is coupled to a pier structure, and the upper region comprises a spherical bearing device. The upright direction is away from a direction of gravity. The apparatus has a clam shell clamp member coupled to the cylindrical bearing and a torque tube coupled to the spherical bearing to support the torque tube from the upper region of the clamp housing member. The torque tube is configured from an off-set position from a center region of rotation.

In an example, the apparatus is configured substantially free from any welds during assembly. Reduced welding lowers cost, improves installation time, avoids errors in installation, improves manufacturability, and reduces component count through standardized parts. The torque tube is coupled to another torque tube via a swage device within a vicinity of the clam shell clamp member. In an example, the connection is low cost, and provides for strong axial and torsional loading. The apparatus is quick to install with the pokey-yoke design. The torque tube is coupled to an elastomeric damper in line to dampen torque movement to be substantially free from formation of a harmonic waveform along any portion of a plurality of solar panels configured to the torque tube. The apparatus also has a locking damper or rigid structure to configure a solar panel coupled to the torque tube in a fixed tilt position to prevent damage to stopper and lock into a foundation—in a position that is substantially free from fluttering in an environment with high movement of air. The apparatus further comprises a controller apparatus configured in an inserter box provided in an underground region to protect the controller apparatus. The apparatus has a drive device to linearly actuate the torque tube. In an example, the apparatus uses an electrical connection coupled to a drive device. In an example, the spherical bearing allows for a construction tolerance, tracker movement, and acts as a bonding path of least resistance taking an electrical current to ground. The apparatus can be one of a plurality of tracker apparatus configured in an array within a geographic region. Each of the plurality of tracker apparatus is driven independently of each other to cause each row to stow independently at a different or similar angle.

Still further, the present invention provides a tracker apparatus comprising a clam shell apparatus, which has a first member operably coupled to a second member to hold a torque tube in place.

In an example, the apparatus also has a clamp housing operably coupled to the clam shell apparatus via a spherical bearing device such that the spherical bearing comprises an axis of rotation. The axis of rotation is different from a center of the torque tube. The apparatus further comprises a solar module coupled to the torque tube.

In an example, the invention provides a tracker apparatus comprising a plurality of torque tubes comprising a first torque tube coupled to a second torque tube coupled to an Nth torque tube, whereupon N is an integer greater than 2. Each pair of torque tubes is coupled to each other free from any welds.

In an example, each pair of torque tubes is swaged fitted together. Each of the torque tubes is cylindrical in shape. Each of the plurality of torque tubes is characterized by a length greater than 80 meters. Each of the torque tubes comprises a plurality of notches. In an example, the apparatus also has a plurality of U-bolt devices coupled respectively to the plurality of notches. Each of the plurality of torque tubes are made of steel.

In an alternative embodiment, the present invention provides a tracker apparatus having a pier member comprising a lower region and an upper region. A clamp holding member is configured to the upper region and is capable of moving in at least a first direction, a second direction opposite to the first direction, a third direction normal to the first direction and the second direction, a fourth direction opposite of the third direction, a fifth direction normal to the first direction, the second direction, the third direction, and the fourth direction, and a sixth direction opposite of the fifth direction.

In yet an alternative embodiment, the present invention provides a solar tracker apparatus. The apparatus has a clamp housing member configured in a upright direction. The clamp housing member comprises a lower region and an upper region. The lower region is coupled to a pier structure. The upper region comprises a spherical bearing device. The upright direction is away from a direction of gravity. The apparatus has a clam shell clamp member coupled to the cylindrical bearing and the clam shell clamp being suspended from the cylindrical bearing. In an example, the apparatus has a torque tube comprising a first end and a second end. The first end is coupled to the spherical bearing to support the torque tube from the upper region of the clamp housing member. The torque tube is configured from an off-set position from a center region of rotation. The apparatus has a drive device coupled to the second end such that the drive device and the torque tube are configured to be substantially free from a twisting action while under a load, e.g., rotation, wind, other internal or external forces.

In an example, the present invention provides a solar tracker apparatus. In an example, the apparatus comprises a center of mass with an adjustable hanger assembly configured with a clam shell clamp assembly on the adjustable hanger assembly and a cylindrical torque tube comprising a plurality of torque tubes configured together in a continuous length from a first end to a second end such that the center of mass is aligned with a center of rotation of the cylindrical torque tubes to reduce a load of a drive motor operably coupled to the cylindrical torque tube.

Some embodiments within the scope of the present disclosure relate to a solar tracker system that includes a support structure, a plurality of multi-glass thin film solar modules, at least one clamp device, and a frame structure. The support structure extends from a first end to a second end, and the support structure includes a torque tube. The plurality of multi-glass thin film solar modules are spatially disposed along the first end to the second end. The at least one clamp device couples a center region between a pair of the multi-glass thin film solar modules. The frame structure configures each of the multi-glass thin film solar modules, and each of the multi-glass thin film solar modules includes a pair of frame-less solar module configured in a landscape orientation.

In certain such further embodiments, each of the frameless solar modules can include a CIGS or CIS semiconductor material. In certain such further embodiments, the support structure can be configured as a balanced support structure. In certain such further embodiments, each of the plurality of multi-glass thin film solar modules can have a first length of two (2) meters in a direction perpendicular to the support structure. In certain such further embodiments, each of the plurality of multi-glass thin film solar modules can have a second length of 0.8 to 1.4 meters in a direction normal to the first direction. In certain such further embodiments, the clamp device can be configured to a rail structure configured to the torque tube. In certain such further embodiments, the torque tube can be configured to an off-set drive. In certain such further embodiments, a micro-inverter device can be coupled to each of the plurality of multi-glass thin film solar modules. In certain such further embodiments, the torque tube can be configured on a base structure. In certain such further embodiments, the torque tube can have a length of 80 meters and greater. In certain such further embodiments, the at least one clamp device can include a pair of openings configured for a U-bolt configured to a portion of the torque tube.

Some embodiments within the scope of the present disclosure relate to a solar tracker system that includes a support structure, a pair of multi-glass thin film solar modules, at least one clamp device, and a frame structure. The support structure extends from a first end to a second end, and the support structure includes a torque tube. The pair of multi-glass thin film solar modules are spatially disposed along the first end to the second end. The at least one clamp device couples a center region between the pair of the multi-glass thin film solar modules. The frame structure configures the pair of the multi-glass thin film solar modules, and the pair of the multi-glass thin film solar modules includes a pair of frame-less solar module configured in a landscape orientation or a portrait orientation.

In certain such further embodiments, each of the frame-less solar modules can include a CIGS or CIS semiconductor material. In certain such further embodiments, the support structure can be configured as a balanced support structure. In certain such further embodiments, the pair of the multi-glass thin film solar modules can have a first length of two (2) meters in a direction perpendicular to the support structure. In certain such further embodiments, the pair of the multi-glass thin film solar modules can have a second length of 0.8 to 1.4 meters in a direction normal to the first direction. In certain such further embodiments, the at least one clamp device can be configured to a rail structure configured to the torque tube. In certain such further embodiments, the torque tube can be configured to an off-set drive. In certain such further embodiments, the system can additionally include a micro-inverter device coupled to each of the plurality of multi-glass thin film solar modules. In certain such further embodiments, the torque tube can be configured on a base structure. In certain such further embodiments, the torque tube can have a length of 80 meters and greater. In certain such further embodiments, the at least one clamp device can include a pair of openings configured for a U-bolt configured to a portion of the torque tube.

FIGS. 16-18 illustrate one exemplary embodiment of a single frame structure. The structures shown at FIGS. 16-18 for the exemplary illustrated embodiment of the single frame structure can be applicable to any one or more (e.g., each) of the other embodiments illustrated and described for the present disclosure (e.g., applicable to each of the embodiments shown at FIGS. 1-15 and 19-23).

FIGS. 16-18 show an exemplary embodiment of a first single frame structure 1600 and a second single frame structure 1700. Each of the first single frame structure 1600 and the second single frame structure 1700 can be configured to support one or more solar modules 1602. For instance, each of the first single frame structure 1600 and the second single frame structure 1700 can be configured to support at least a pair of solar modules 1602. The first single frame structure 1600 can be configured to receive and support a pair of solar modules 1602a, 1602b, and the second single frame structure 1700 can be configured to receive and support a pair of solar modules 1602c, 1602d. Each solar module 1602 can include a CIGS or CIS semiconductor material at which are included a plurality of photovoltaic cells. The CIGS or CIS semiconductor material of the solar module 1602 can interfaces with the respective first or second single frame structure 1600, 1700.

The first single frame structure 1600 can include a first module receptacle 1610 at a first side 1604 of the first single frame structure 1600 and a second module receptacle 1612 at a second side 1606 of the first single frame structure 1600 opposite the first side 1604 of the first single frame structure 1600. The first single frame structure 1600 can receive each of a first pair of solar modules 1602a, 1602b at the first and second module receptacles 1610, 1612. The first single frame structure 1600 can further include a first coupling flange 1614 extending out from the first side 1604 of the single frame structure 1600, and the first single frame structure 1600 can further include a second coupling flange 1616 extending out from the second side 1606 of the single frame structure 1600. Additionally, the first single frame structure 1600 can include a first coupling flange receptacle 1618 defined at the first side 1604 of the first single frame structure 1600 adjacent to the first coupling flange 1614. Similarly, at the second side 1606, the first single frame structure 1600 can include a second coupling flange receptacle 1620 defined at the second side 1606 of the first single frame structure 1600 adjacent to the second coupling flange 1616.

Each of the first pair of solar modules 1602a, 1602b can be frame-less at an interface between each of the first pair of solar modules 1602a, 1602b and the first module receptacle 1610 and at an interface between each of the first pair of solar modules 1602a, 1602b and the second module receptacle 1612. For example, each of the first pair of solar modules 1602a, 1602b can include a CIGS or CIS semiconductor material that interfaces with each of the first module receptacle 1610 and the second module receptacle 1612.

In some embodiments, to help provide a repeatable, complementary interconnection amongst two adjacent single frame structures, as shown at the exemplary embodiment at FIGS. 16-18, an elevational arrangement of the first coupling flange 1614 and the first coupling flange receptacle 1618 at the first side 1604 of the first single frame structure 1600 can be an inverse of an elevational arrangement of the second coupling flange 1616 and the second coupling flange receptacle 1620 at the second side 1606 of the first single frame structure 1600.

The first single frame structure 1600 can further define and include one or more plenums at the single frame structure. For example, the first single frame structure 1600 can define and include a first plenum 1630 and a second plenum 1632. The first plenum 1630 can be defined and extend between the first module receptacle 1610 and the first coupling flange 1614 at the first side 1604 of the first single frame structure 1600. The second plenum 1632 can be defined and extend between the second module receptacle 1612 and the second coupling flange 1616 at the second side 1606 of the first single frame structure 1600.

As noted, FIGS. 16-18 also illustrate the second single frame structure 1700. In some embodiments, the second single frame structure 1700 can be similar to that disclosed herein with respect to the first single frame structure 1600.

The second single frame structure 1700 can include a second frame structure first module receptacle 1710 at a first side 1704 of the second single frame structure 1700 and a second frame structure second module receptacle 1712 at a second side 1706 of the second single frame structure 1700 opposite the first side 1704 of the second single frame structure 1700. The second single frame structure 1700 can receive each of a second pair of solar modules 1602c, 1602d at the first and second module receptacles 1710, 1712. The second single frame structure 1700 can further include a first coupling flange 1714 extending out from the first side 1704 of the single frame structure 1700, and the second single frame structure 1700 can further include a second coupling flange 1716 extending out from the second side 1706 of the single frame structure 1700. Additionally, the second single frame structure 1700 can include a first coupling flange receptacle 1718 defined at the first side 1704 of the second single frame structure 1700 adjacent to the first coupling flange 1714. Similarly, at the second side 1706, the second single frame structure 1700 can include a second coupling flange receptacle 1720 defined at the second side 1706 of the second single frame structure 1700 adjacent to the second coupling flange 1716.

Similar to that described with respect to the first single frame structure 1600 and the first pair of solar modules 1602*a*, 1602*b*, each of the second pair of solar modules 1602*c*, 1602*d* can be frame-less at an interface between each of the second pair of solar modules 1602*c*, 1602*d* and the first module receptacle 1710 and at an interface between each of the second pair of solar modules 1602*c*, 1602*d* and the second module receptacle 1712. For example, each of the second pair of solar modules 1602*c*, 1602*d* can include a CIGS or CIS semiconductor material that interfaces with each of the first module receptacle 1710 and the second module receptacle 1712.

Similar to that described for the illustrated embodiment of the first single frame structure 1600, the second single frame structure 1700 can have an elevational arrangement of the first coupling flange 1714 and the first coupling flange receptacle 1718 at the first side 1704 of the second single frame structure 1700 as an inverse of an elevational arrangement of the second coupling flange 1716 and the second coupling flange receptacle 1720 at the second side 1706 of the second single frame structure 1700. For instance, the first single frame structure 1600 can have the first coupling flange 1614 at a different elevation than the second frame structure 1700 has the first coupling flange 1714, and the first single frame structure 1600 can have the first coupling flange receptacle 1620 at a different elevation than the second frame structure 1700 has the first coupling flange receptacle 1720.

In some embodiments, the coupling flange 1614 and coupling flange receptacle 1620 of the first single frame structure 1600 can be configured receive and couple to the second single frame structure 1700, and, likewise, the coupling flange 1714 and the coupling flange receptacle 1720 of the second single frame structure 1700 can be configured receive and couple to the first single frame structure 1600. For example, as shown for the illustrated embodiment at FIGS. 16-18, the first frame structure coupling flange 1614 is received at the second frame structure first coupling flange receptacle 1718, and the second frame structure coupling flange 1714 is received at the first frame structure first coupling flange receptacle 1618. For instance, as shown for the illustrated example, the first frame structure coupling flange 1614 can contact the second frame structure coupling flange 1714 along a length between the first side 1604 of the first single frame structure 1600 and the first side 1704 of the second single frame structure 1700. In one particular such example, this can include the first frame structure coupling flange 1614 and the second frame structure coupling flange 1714 overlaying one another along the length between the first side 1604 of the first single frame structure 1600 and the first side 1704 of the second single frame structure 1700.

The second single frame structure 1700 can further define and include one or more plenums at the single frame structure 1700. For example, the first single frame structure 1700 can define and include a first plenum 1730 and a second plenum 1732. The first plenum 1730 can be defined and extend between the first module receptacle 1710 and the first coupling flange 1714 at the first side 1704 of the single frame structure 1700. The second plenum 1732 can be defined and extend between the second module receptacle 1712 and the second coupling flange 1716 at the second side 1706 of the second single frame structure 1700.

Referring to the exemplary embodiments of the solar tracking system shown at FIGS. 19-23, in addition to one or more of the single frame structures (e.g., in addition to each of the first and second single frame structures 1600, 1700), a solar tracking system can include a clamping device 1800. The clamping device 1800 can be between the first single frame structure 1600 and the second single frame structure 1700, the clamping device 1800 can couple the first single frame structure 1600 to the second single frame structure 1700.

In some exemplary embodiments, the clamping device 1800 can include a rail 1802. The rail 1802 can include a pair of bolt receptacles 1803. The clamping device 1800 can further include a u-bolt 1804 received at each of the pair of bolt receptacles 1803 at the rail 1802 to couple the first single frame structure 1600 and the second single frame structure 1700 to a torque tube 1810. As illustrated for the exemplary embodiment shown here, the torque tube 1810 can be bounded by the u-bolt 1804 and the rail 1802 around an entire perimeter of the torque tube 1810 at a longitudinal location along the torque tube 1810 where the rail 1802 and the u-bolt 1804 are present.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A solar tracking system comprising:
   a torque tube extending from a first torque tube end to a second torque tube end that is opposite the first torque tube end;
   a first single frame structure coupled to the torque tube, the first single frame structure comprising:
      a first frame structure first module receptacle at a first side of the first single frame structure,
      a first frame structure second module receptacle at a second side of the first single frame structure opposite the first side of the first single frame structure,
      a first pair of solar modules received at the first frame structure first module receptacle and at the first frame structure second module receptacle,
      a first frame structure coupling flange extending out from the first side of the first single frame structure, and
      a first frame structure coupling flange receptacle defined at the first side of the first single frame structure adjacent to the first frame structure coupling flange;
   a second single frame structure coupled to the torque tube, the second single frame structure comprising:
      a second frame structure first module receptacle at a first side of the second single frame structure,
      a second frame structure second module receptacle at a second side of the second single frame structure opposite the first side of the second single frame structure, a second pair of solar modules received at the second frame structure first module receptacle and at the second frame structure second module receptacle, a second frame structure coupling flange extending out from the first side of the second single frame structure, and a second frame structure coupling flange receptacle defined at the first side of the second single frame structure adjacent to the second frame structure coupling flange; and a clamping device between the first single frame structure and the second single frame structure, the clamping device coupling the first single frame structure to the second single frame structure.

2. The system of claim 1, wherein the first frame structure coupling flange is received at the second frame structure coupling flange receptacle, and wherein the second frame structure coupling flange is received at the first frame structure coupling flange receptacle.

3. The system of claim 2, wherein the first frame structure first and second module receptacles are at different elevations along the first frame structure than each of the first frame structure coupling flange and the first frame structure coupling flange receptacle.

4. The system of claim 2, wherein the first frame structure coupling flange contacts the second frame structure coupling flange along a length between the first side of the first single frame structure and the first side of the second single frame structure.

5. The system of claim 4, wherein the first frame structure coupling flange and the second frame structure coupling flange overlay one another along the length between the first side of the first single frame structure and the first side of the second single frame structure.

6. The system of claim 5, wherein the first frame structure coupling flange is disposed at a different elevation along the first side of the first single frame structure than the second frame structure coupling flange is disposed along the first side of the second single frame structure.

7. The system of claim 2, wherein the first frame structure further comprises a first plenum extending between the first frame structure first module receptacle at the first side of the first single frame structure and the first frame structure coupling flange at the first side of the first single frame structure, and wherein the second frame structure further comprises a second plenum extending between the second frame structure first module receptacle at the first side of the second single frame structure and the second frame structure coupling flange at the first side of the second single frame structure.

8. The system of claim 1, wherein the first frame structure further comprises:

a first frame structure second coupling flange extending out from the second side of the first single frame structure, and a first frame structure second coupling flange receptacle defined at the second side of the first single frame structure adjacent to the first frame structure second coupling flange.

9. The system of claim 8, wherein an elevational arrangement of the first frame structure second coupling flange and the first frame structure second coupling flange receptacle at the second side of the first single frame structure are an inverse of an elevational arrangement of the first frame structure coupling flange and the first frame structure coupling flange receptacle at the first side of the first single frame structure.

10. The system of claim 8, wherein the second frame structure further comprises:

a second frame structure second coupling flange extending out from the second side of the second single frame structure, and a second frame structure second coupling flange receptacle defined at the second side of the second single frame structure adjacent to the second frame structure second coupling flange.

11. The system of claim 1, wherein the clamping device comprises a rail having a pair of bolt receptacles, and wherein the solar tracking system further comprises a u-bolt received at each of the pair of bolt receptacles at the rail to couple the first single frame structure to the torque tube, wherein the torque tube is bounded by the u-bolt and the rail around an entire perimeter of the torque tube at a location of the rail and the u-bolt.

12. The system of claim 1, wherein each of the first pair of solar modules is frame-less at an interface between each of the first pair of solar modules and the first frame structure first module receptacle and at an interface between each of the first pair of solar modules and the first frame structure second module receptacle, and wherein each of the second pair of solar modules is frame-less at an interface between each of the second pair of solar modules and the second frame structure first module receptacle and at an interface between each of the second pair of solar modules and the second frame structure second module receptacle.

13. The system of claim 12, wherein each of the first pair of solar modules comprises a CIGS or CIS semiconductor material that interfaces with each of the first frame structure first module receptacle and the first frame structure second module receptacle, and wherein each of the second pair of solar modules comprises a CIGS or CIS semiconductor material that interfaces with each of the second frame structure first module receptacle and the second frame structure second module receptacle.

14. A solar tracking system comprising:

a torque tube extending from a first torque tube end to a second torque tube end that is opposite the first torque tube end;

a first single frame structure coupled to the torque tube, the first single frame structure comprising:

a first frame structure first module receptacle at a first side of the first single frame structure, a first frame structure second module receptacle at a second side of the first single frame structure opposite the first side of the first single frame structure, a first pair of solar modules received at the first frame structure first module receptacle and at the first frame structure second module receptacle, a first frame structure first coupling flange extending out from the first side of the first single frame structure, and a first frame structure first coupling flange receptacle defined at the first side of the first single frame structure adjacent to the first frame structure coupling flange a first frame structure second coupling flange extending out from the second side of the first single frame structure;

a first frame structure second coupling flange receptacle defined at the second side of the first single frame structure adjacent to the first frame structure second coupling flange; and a second single frame structure coupled to the torque tube, the second single frame structure comprising:

a second frame structure first module receptacle at a first side of the second single frame structure, a second frame structure second module receptacle at a second side of the second single frame structure opposite the first side of the second single frame structure, a second pair of solar modules received at the second frame structure first module receptacle and at the second frame structure second module receptacle, a second frame structure coupling flange extending out from the first side of the second single frame structure, and a second frame structure coupling flange receptacle defined at the first side of the second single frame structure adjacent to the second frame structure coupling flange.

15. A solar tracking system comprising:

a torque tube extending from a first torque tube end to a second torque tube end that is opposite the first torque tube end;

a first single frame structure coupled to the torque tube, the first single frame structure comprising:

a first frame structure first module receptacle at a first side of the first single frame structure, a first frame structure second module receptacle at a second side of the first single frame structure opposite the first side of the first single frame structure, a first pair of solar modules received at the first frame structure first module receptacle and at the first frame structure second module receptacle, wherein each of the first pair of solar modules is frame-less at an interface between each of the first pair of solar modules and the first frame structure first module receptacle and at an interface between each of the first pair of solar modules and the first frame structure second module receptacle, a first frame structure coupling flange extending out from the first side of the first single frame structure, and a first frame structure coupling flange receptacle defined at the first side of the first single frame structure adjacent to the first frame structure coupling flange; and a second single frame structure coupled to the torque tube, the second single frame structure comprising:

a second frame structure first module receptacle at a first side of the second single frame structure, a second frame structure second module receptacle at a second side of the second single frame structure opposite the first side of the second single frame structure, a second pair of solar modules received at the second frame structure first module receptacle and at the second frame structure second module receptacle, wherein each of the second pair of solar modules is frame-less at an interface between each of the second pair of solar modules and the second frame structure first module receptacle and at an interface between each of the second pair of solar modules and the second frame structure second module receptacle, a second frame structure coupling flange extending out from the first side of the second single frame structure, and a second frame structure coupling flange receptacle defined at the first side of the second single frame structure adjacent to the second frame structure coupling flange.

* * * * *